US008572525B2

(12) United States Patent
Chew et al.

(10) Patent No.: US 8,572,525 B2
(45) Date of Patent: Oct. 29, 2013

(54) PARTITION RESPONSE SURFACE MODELING

(75) Inventors: Marko P Chew, Palo Alto, CA (US); Yue Yang, Cupertino, CA (US); Toshikazu Endo, San Jose, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 335 days.

(21) Appl. No.: 12/861,777

(22) Filed: Aug. 23, 2010

(65) Prior Publication Data

US 2011/0047520 A1    Feb. 24, 2011

Related U.S. Application Data

(60) Provisional application No. 61/235,883, filed on Aug. 21, 2009.

(51) Int. Cl.
*G06F 17/50*    (2006.01)

(52) U.S. Cl.
USPC ............................................................. 716/55

(58) Field of Classification Search
USPC ........................................................ 716/55
See application file for complete search history.

(56) References Cited

U.S. PATENT DOCUMENTS

| 6,883,153 | B2* | 4/2005 | Jiang et al. ..................... 716/108 |
| 7,174,520 | B2* | 2/2007 | White et al. .................... 716/136 |
| 7,765,021 | B2* | 7/2010 | Mansfield et al. ............. 700/108 |
| 2008/0155482 | A1* | 6/2008 | Chidambarrao et al. ......... 716/2 |
| 2009/0113359 | A1 | 4/2009 | Chew et al. |
| 2010/0023916 | A1 | 1/2010 | Chew et al. |

OTHER PUBLICATIONS

Singer et al., "Universal Linear Least Squares Prediction: Upper and Lower Bounds.", IEEE Transactions on Information Theory, vol. 48, No. 8, p. 2354-2362, Aug. 2002.*

Resolution Enhancement Technology: The Past, the Present, and Extensions for the Future, Frank M. Schellenberg, Optical Microlithography XVII, edited by Bruce W. Smith, Proceedings of SPIE vol. 5377, May 2004.

* cited by examiner

*Primary Examiner* — Jack Chiang
*Assistant Examiner* — Brandon Bowers
(74) *Attorney, Agent, or Firm* — Klarquist Sparkman, LLP

(57)    ABSTRACT

A group of models are developed to predict printed contour deviations relative to the corresponding layout edges for different classes of layout topologies. A plurality of calibration layouts with topologies belonging to a class of layout topologies are used to generate a model for the class of layout topologies. A standard least square regression is modified for model creation. The model error may be monitored dynamically.

28 Claims, 9 Drawing Sheets

PARTITION RESPONSE SURFACE MODELING

RELATED APPLICATIONS

This application claims priority to U.S. Provisional Patent Application No. 61/235,883, entitled "Partition Response Surface Modeling," filed on Aug. 21, 2009, and naming Yue Yang et al. as inventors, which application is incorporated entirely herein by reference.

FIELD OF THE INVENTION

The present invention is directed to semiconductor manufacturing. Various aspects of the invention may be particularly useful for predicting printed contour deviations based on layout data.

BACKGROUND OF THE INVENTION

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or polylines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, "optical proximity correction" or "optical process correction" (OPC), adjusts the amplitude of the light transmitted through a lithographic mask by modifying the design layout data employed to create the mask. For example, edges in the design layout may be adjusted to make certain portions of the geometric elements larger or smaller, in accordance with how much additional light exposure (or lack of exposure) is desired at certain points on the substrate. When these adjustments are appropriately calibrated, overall pattern fidelity is greatly improved.

Even with the application of RETs, some layout regions may still have printability issues. These regions are called lithography hotspots or litho hotspots. Such litho-hotspots can only be corrected by modifying design layouts in such a manner as to cause a change in the final printed contours. For example, pinching litho hotspots require an increase of the width of a printed contour subject to pinching while bridging litho hotspots requires an increase of the spacing between two printed contours subject to bridging. In addition to the limitations in repairing litho hotspots, RETs are also expensive. The mask cost has dramatically been increased to multimillions of dollars per set mainly by RETs. Accordingly, it helps to reduce the overall manufacturing cost and increase the manufacturability if design layouts are optimized based on the manufacturing or printing effects during the physical layout design stage. Another benefit for addressing printability issues early on is that the design intent can be better preserved due to the involvement of physical layout designers. To realize these benefits, it is desirable to abstract and predict the manufacturing or printing effects fairly accurately and without significant computation costs.

BRIEF SUMMARY OF THE INVENTION

Aspects of the invention relate to creating models for predicting how printing contours change as a function of design layout changes. A group of models rather than a single model are created for dealing with different classes of layout topologies that may exist in a design layout. The different classes of layout topologies may represent layout patterns associated with different litho hotspots in various embodiments of the invention. Each model in the group may be created by using a plurality of calibration layouts that have layout topologies belonging to one class of layout topologies. The plurality of calibration layouts may be generated by a place and route tool. Some or all of the plurality of calibration layouts may also be extracted from one or more design layouts.

Contour deviation information and density information for the plurality of calibration layouts are used for the model creation. The contour deviation information may be derived based on printed contour information. The printed contour information may be generated through a lithography simulation process. With some implementations of the invention, one or more RET treatments is applied to the plurality of calibration layouts prior to lithography simulation. The density information may be derived by using a grid to divide a calibration layout into layout regions and then calculating a density value for each layout region.

A linear relationship between the contour deviation information and the density information may be assumed. Coefficients that transfer the density information to the contour deviation information may be derived using a least square regression such as ridge regression. The least square regression may be modified by assigning weights inversely proportionally on residual values when computing final coefficients. Model errors may be monitored dynamically with an error bound function.

DETAILED DESCRIPTION OF THE INVENTION

Figure 1:
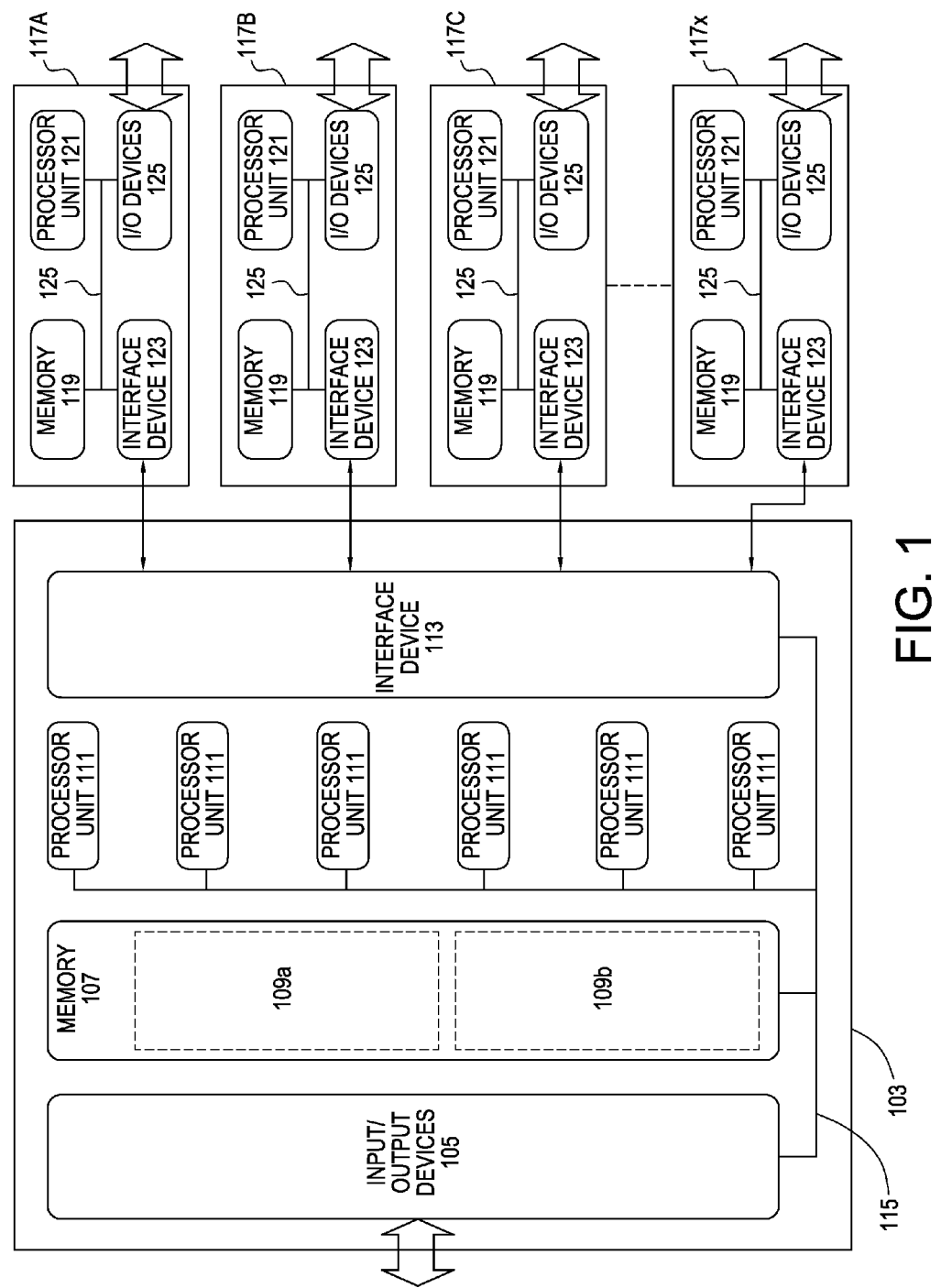
FIG. 1 illustrates an example of a computing system that may be used to implement various embodiments of the invention.

Various aspects of the present invention relate to creating models for predicting how printing contours change as a function of design layout changes. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "derive," "generate" and "create" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "layout" is intended to encompass data describing an entire integrated circuit device. This term also is intended to encompass a smaller group of data describing one or more components of an entire device, however, such as a portion of an integrated circuit device. Still further, the term "layout" also is intended to encompass data describing more than one microdevice, such as data to be used to form multiple microdevices on a single wafer.

Operating Environment

The execution of various electronic design automation processes may be implemented using computer-executable software instructions executed by one or more programmable computing devices. Because these examples of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or slave computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
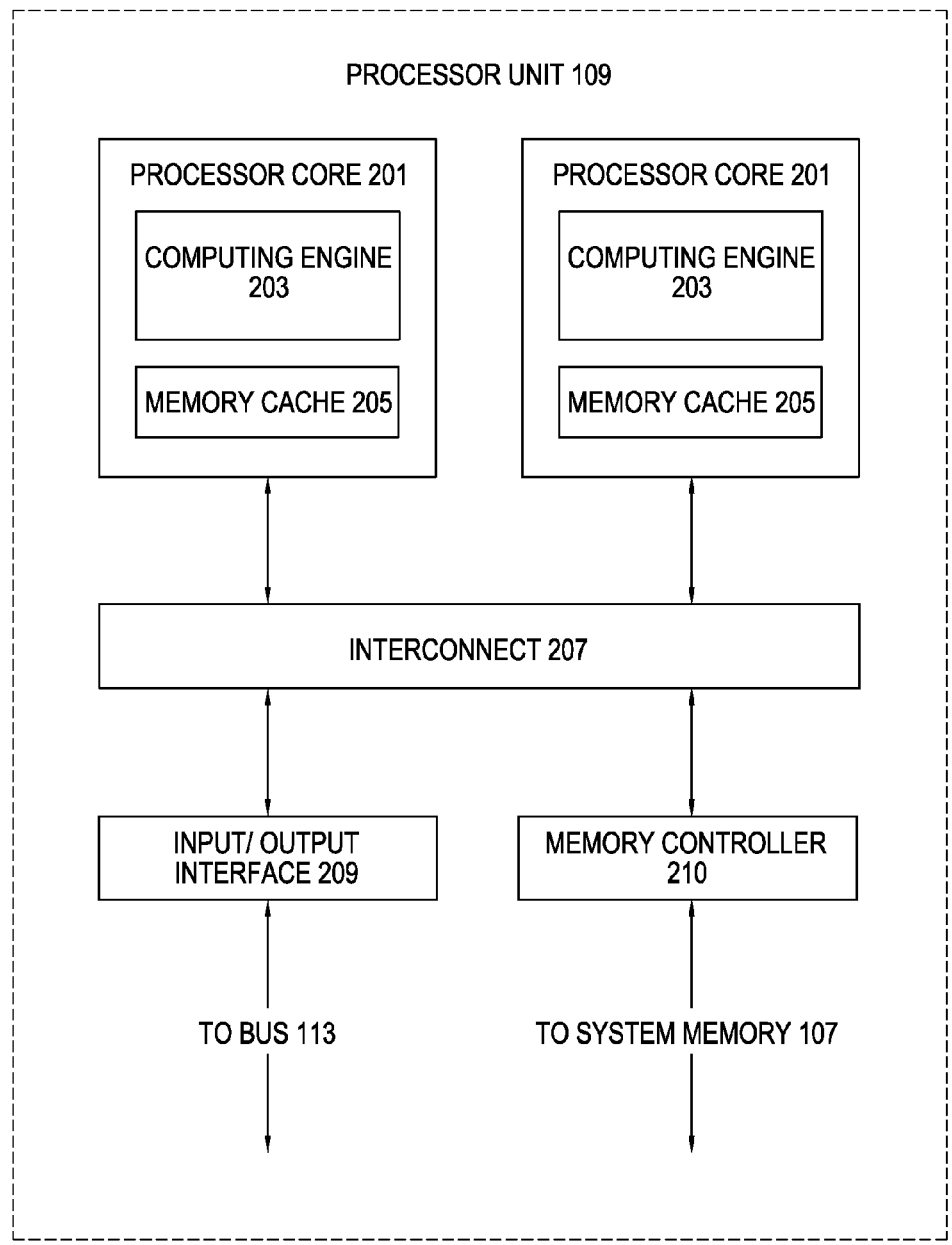
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs)

and a power processor element (PPE). Each synergistic processor element has a vector-type computing engine 203 with 128×128 bit registers, four single-precision floating point computational units, four integer computational units, and a 256 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the slave computers 117A, 115?, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the slave computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 117 may include a memory 119, a processor unit 121, an interface device 122, and, optionally, one more input/output devices 125 connected together by a system bus 127. As with the master computer 103, the optional input/output devices 125 for the slave computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the slave computers 117 to communicate with the master computer 103 over the communication interface.

In the illustrated example, the master computer 103 is a multi-processor unit computer with multiple processor units 111, while each slave computer 117 has a single processor unit 121. It should be noted, however, that alternate implementations of the invention may employ a master computer having single processor unit 111. Further, one or more of the slave computers 117 may have multiple processor units 121, depending upon their intended use, as previously discussed. Also, while only a single interface device 113 or 123 is illustrated for both the master computer 103 and the slave computers, it should be noted that, with alternate embodiments of the invention, either the computer 103, one or more of the slave computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the slave computers 117 may alternately or additions be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Model Creation Tool

Figure 3:
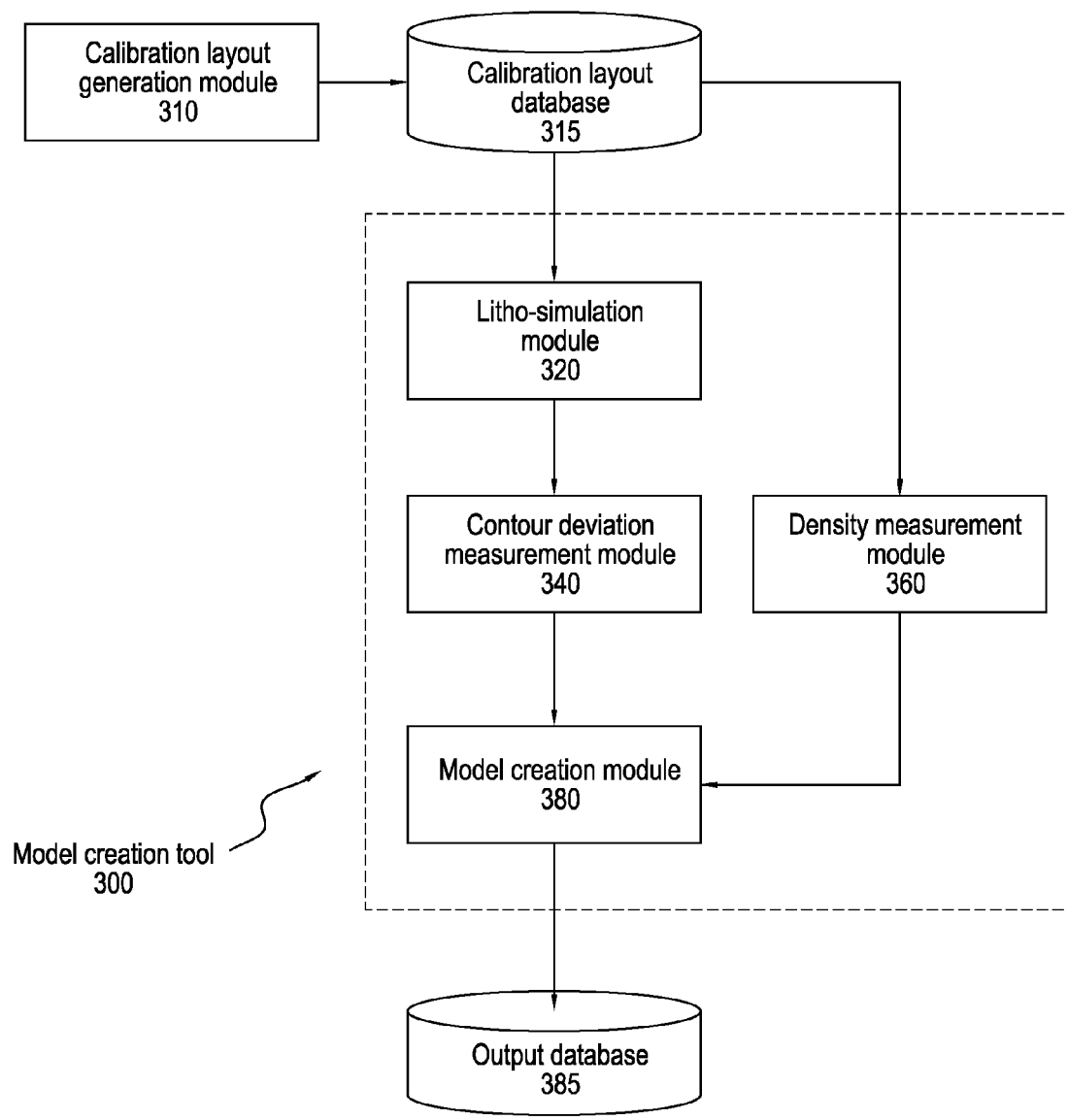
FIG. 3 illustrates an example of a model creation tool.

FIG. 3 illustrates an example of a model creation tool 300 that may be implemented according to various embodiments of the invention. As seen in the figure, the model creation tool 300 includes a litho-simulation module 320, a contour deviation measurement module 340, a density measurement module 360, and a model creation module 380. As also shown in this figure, various implementations of the layout decomposition tool 300 may cooperate with (or incorporate, in whole or part) a calibration layout generation module 310, a calibration layout database 315 and an output database 385.

Figure 5A:
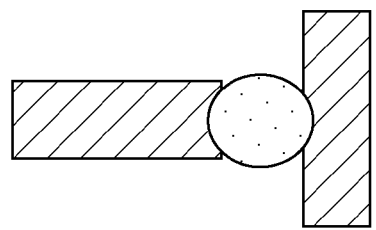
FIG. 5a illustrates a class of layout topologies for line end-to-shape bridging.
Figure 5B:
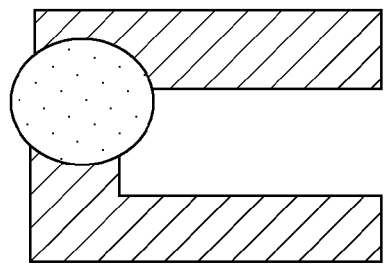
FIG. 5b illustrates a class of layout topologies for slot end pinching.
Figure 5C:
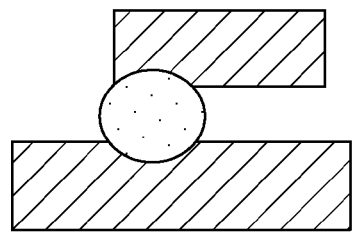
FIG. 5c illustrates a class of layout topologies for convex-to-shape bridging.
Figure 5D:
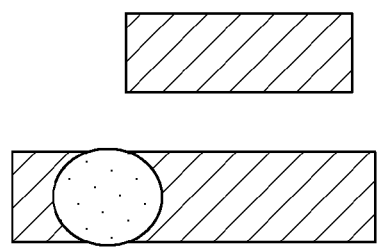
FIG. 5d illustrates a class of layout topologies for neighboring convex pinching.

As will be discussed in detail below, the model creation tool 300 may use calibration layouts stored in the calibration layout database 315 to create models for predicting how printing contours change as a function of design layout changes. A group of models rather than a single model are created for dealing with different classes of layout topologies which may exist in a design layout. For each model, the calibration layout generation module 310 generates a plurality of calibration layouts. The plurality of calibration layouts are layouts having topologies belonging to one class of layout topologies. In various embodiments of the invention, different classes of layout topologies may represent layout patterns associated with different categories of litho hotspots such as the four categories illustrated in FIGS. 5a (line end-to-shape bridging), 5b (slot end pinching), 5c (convex-to-shape bridging), and 5d (neighboring convex pinching). Accordingly, one model may be generated for use in repairing a specific category of litho hotspots. It should be appreciated that litho hotspot repairs is just one application for the models generated accordingly to various embodiments of the invention.

After the model creation tool 300 receives a plurality of calibration layouts with topologies belonging to one class of layout topologies, the tool 300 delivers the plurality of calibration layouts to two of its modules, the litho-simulation module 320 and the density measurement module 360. The litho-simulation module 320 performs lithography simulation to generate printed contour information for the plurality of calibration layouts. In various embodiments of the invention, the litho-simulation module 320 may include a RET sub-module. The RET sub-module applies one or more RET treatments to the plurality of calibration layouts prior to lithography simulation. After the printed contour information is derived, the contour deviation measurement module 340 calculates deviations of printed contours relative to the corresponding layout edges to generate contour deviation information. The density measurement module 360, on the other hand, derives density information for the plurality of calibration layouts. The model creation module 380 completes model creation for the one class of layout topologies by deriving the relationship between the contour deviation information and the density information through a least square regression process. During the least square regression process, the model creation module 380 may monitor model errors dynamically with an error bound function.

As previously noted, various embodiments of the invention may be embodied by a computing system, such as the computing system illustrated in FIG. 1 and FIG. 2. Accordingly, one or more components of each of the calibration layout generation module 310, the litho-simulation module 320, the contour deviation measurement module 340, the density measurement module 360, and the model creation module 380 may be implemented using one or more processors in a computing system. It should be appreciated that, while these five modules are shown as separate units in FIG. 3, a single computer (or a single processor in a computing system) may be used to implement two or more of these modules at different times. Also, various examples of the invention may be embodied by software-executable instructions, stored on a computer-readable medium, for instructing a computing system to implement one or more components of each of the calibration layout generation module 310, the litho-simulation module 320, the contour deviation measurement module 340, the density measurement module 360, and the model creation module 380. Further, while the calibration layout database 315 and the output database 385 are shown as separate units in FIG. 3, a single computer accessible medium may be used to implement two or all three of these databases. Still further, each module may either be fully automated or allow a user to provide instructions for an operation.

Model Creation

Figure 4:
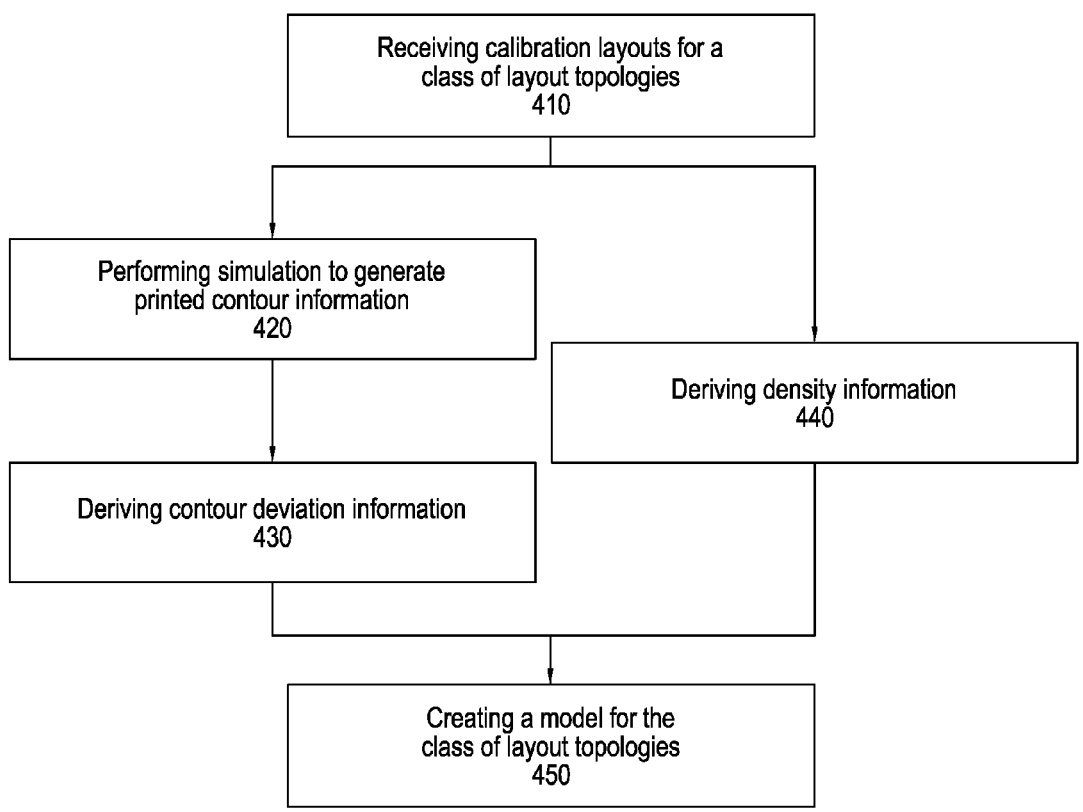
FIG. 4 illustrates a flowchart describing methods of creating a model for a class of layout topologies.

FIG. 4 illustrates a flowchart describing methods of model creation according to various embodiments of the invention. For purposes of explanation, various methods encompassed in FIG. 4 will be described with reference to the model creation tool 300 shown in FIG. 3. It should be appreciated that the operations illustrated in FIG. 4 may be employed by implementations of a different model creation tool, according to various embodiments of the invention. Likewise, it should be appreciated that the model creation tool 300 shown in FIG. 3 may be used to perform model creation methods according to various embodiments of the invention different from those encompassed by the flowchart of FIG. 4.

Also, it should be appreciated that various embodiments of the invention may be implemented by a system comprising one or more processors programmed to perform the operations described in FIG. 4. Still further, various embodiments of the invention may be implemented by processor-executable instructions, stored in a processor-readable medium, for causing one or more processors to perform the operations described in FIG. 4.

The flow illustrated in FIG. 4 starts with operation 410, receiving calibration layouts for a class of layout topologies by the model creation tool 300. As discussed in the previous section, a group of models rather than a single model are created for different classes of layout topologies which may exist in a design layout. The classification of layout topologies may depend on applications. For litho hotspot repairs, for example, each class of layout topologies may be associated with a type of hotspot. FIGS. 5*a*, 5*b*, 5*c* and 5*d* illustrate four types of litho hotspots. The classification of layout topologies may also depend on computing power available or model fitness desired. The finer the categorization, the greater the computing power required, and the more accurate the model prediction. The model created by the model creation tool 300 may be used to predict printed contour's deviation from a corresponding layout edge, i.e. the printed contour's location relative to the layout edge's location, as a function of layout feature changes. The layout feature changes include, among others, adding/removing features, and changing features' locations/sizes/shapes.

Figure 6:
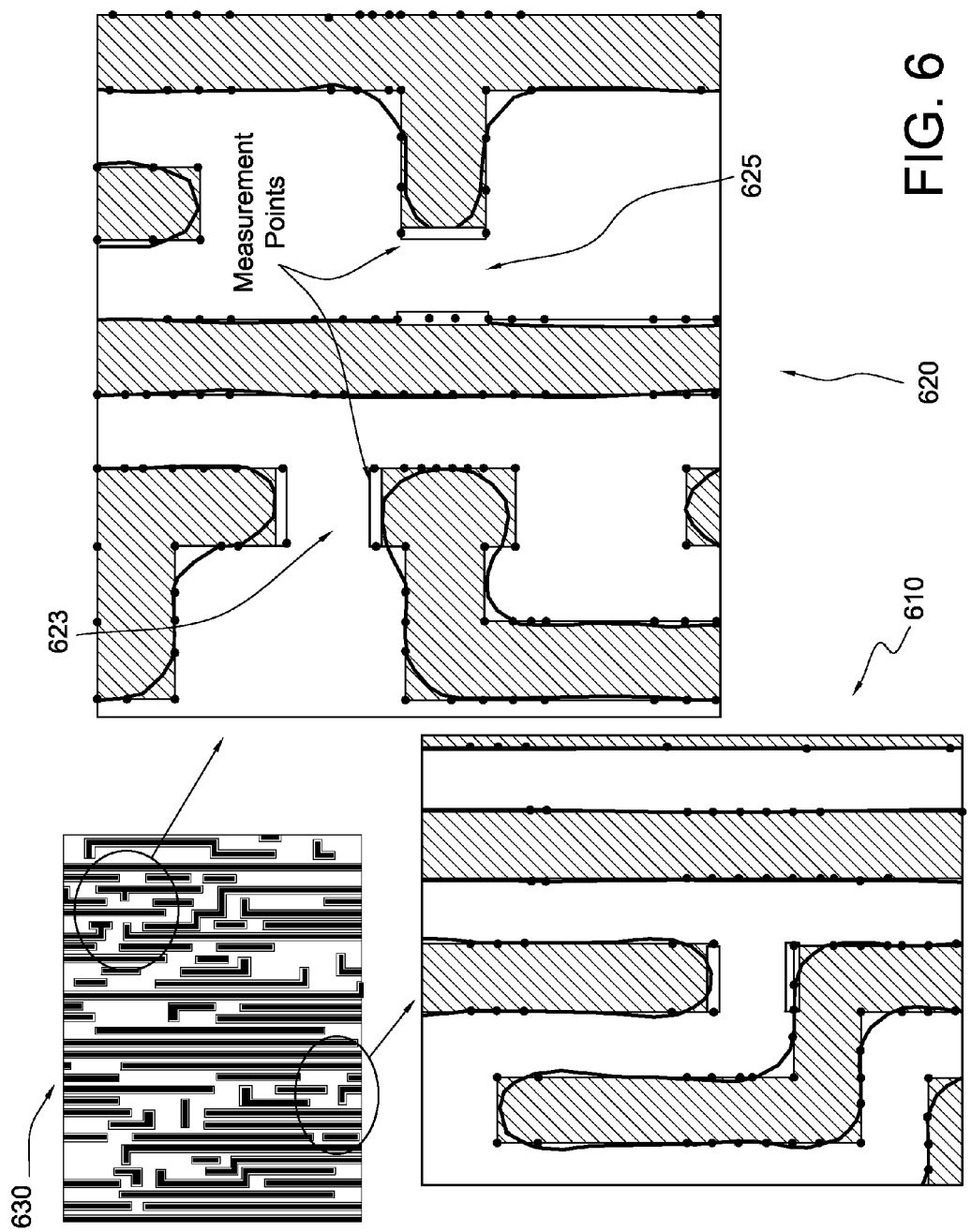
FIG. 6 illustrates extraction of layout portions with topologies belonging to one or more classes of layout topologies from a design layout.

To create a model for one class of layout topologies, a plurality of calibration layouts are needed. The plurality of calibration layouts are layouts with topologies belonging to the one class of layout topologies and may be generated by the calibration layout generation module 310. With some implementations of the invention, the module 310 includes employs a place and route tool (e.g., the OLYMPUS-SOC place and route system available from Mentor Graphics Corporation, Wilsonville, Oreg.). The place and route tool can create calibration layouts based on desired layout topologies. Alternatively or additionally, the calibration layout generation module 310 may extract layout portions with desired topologies from an existing design layout and use these layout portions as calibration layouts. Some tools included in the CALIBRE family of software tools available from Mentor Graphics Corporation, Wilsonville, Oreg., may be incorporated in or otherwise employed by the calibration layout generation module 310 for the extraction purpose. In FIG. 6, two layout portions 610 and 620 are extracted from a design layout portion 630. The layout portion 620 includes two hotspots 623 and 625 belonging to two categories of hotspots, one for pinching (625) and one for bridging (623). It should be appreciated that the above two approaches may be combined for generating the plurality of calibration layouts by the calibration layout generation module 310.

In operation 420, the litho-simulation module 320 uses a litho simulator to perform lithography simulation on the plurality of calibration layouts received. The litho simulator can be found in various commercial EDA tools such as the CALIBRE family of software tools available from Mentor Graphics Corporation, Wilsonville, Oreg. The lithography simulation may generate printed contour information for the plurality of calibration layouts. In various embodiments of the invention, the litho-simulation module 320 may include a RET sub-module. The RET sub-module applies one or more RET treatments to the plurality of calibration layouts before the lithography simulation. The RET treatments include, for example, conducting OPC, adding sub-resolution assist features (SRAFs), and retargeting. It should be appreciated that the operation 420 may be executed prior to the operation 410. For example, before extracting calibration layouts from a design layout, lithography simulation (and one or more RET treatments in some embodiments) may be performed on the design layout.

Figure 7:
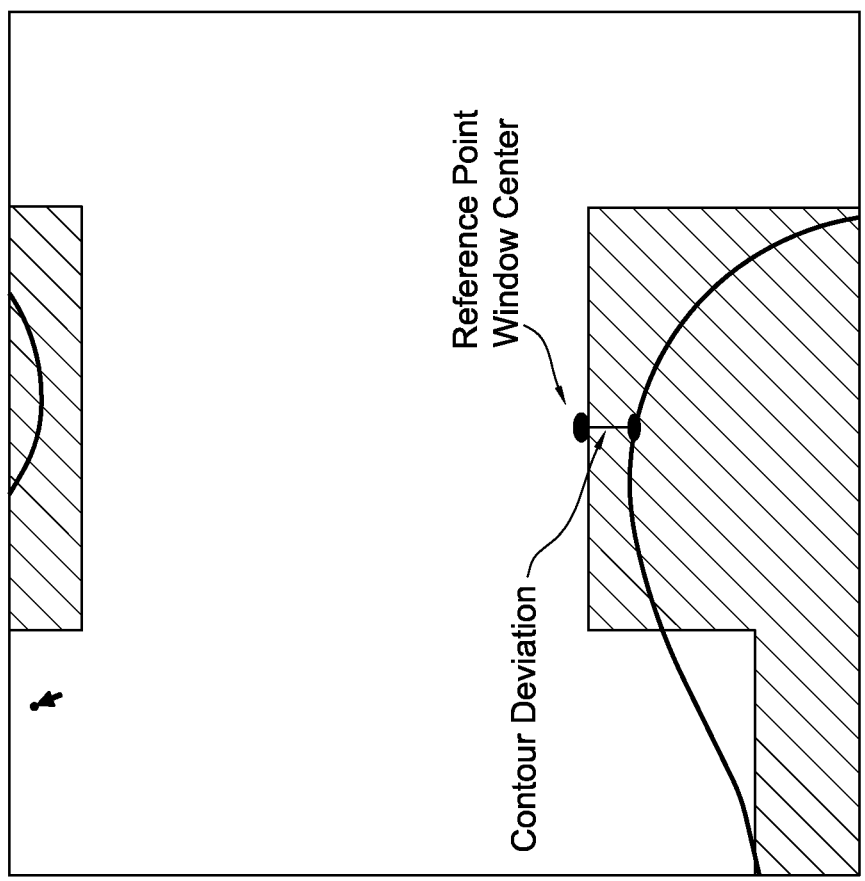
FIG. 7 illustrates deviation of a printed contour from the corresponding layout edge.

After the printed contour information is generated, the contour deviation measurement module 340 derives, in operation 430, contour deviation information by calculating deviations of printed contours relative to the corresponding layout edges, as illustrated in FIG. 7.

Figure 8:
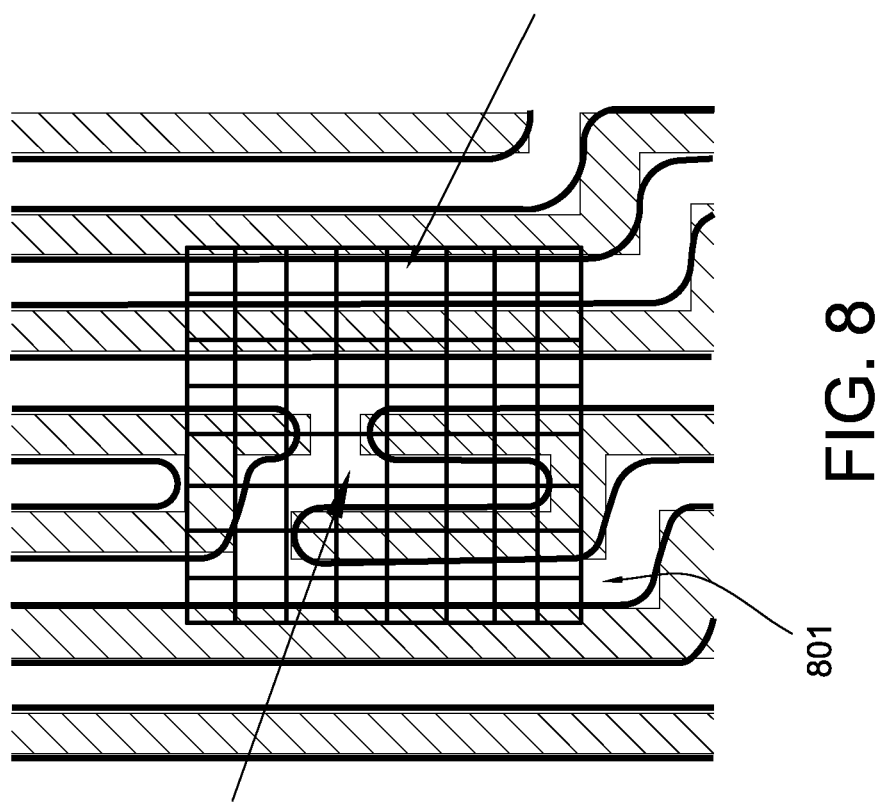
FIG. 8 illustrates using a grid to divide a calibration layout into a set of layout regions.

In operation 440, the density measurement module 360 derives density information for the plurality of calibration layouts. In various embodiments of the invention, the module 360 uses a grid to divide each of the plurality of calibration layouts into small layout regions and calculate a density value (such as the percentage of area filled by layout features) for each of the small layout regions. FIG. 8 shows an example of such a grid 801. As previously noted, the model to be created predicts a printed contour's deviation from a corresponding layout edge as a function of layout feature changes. Only features within a certain distance of the layout edge may have noticeable effects on the location of the printed contour and thus be considered. One factor for deciding the distance is the wavelength of light source employed for lithography. Accordingly, the total size of the grid may be in the range of a few times of the wavelength (e.g. 1 or 2 um). Other factors such as those related to the lithography process may also be considered. The size of small layout regions (i.e. the grid size) depends on many factors as well, such as the size of layout features, the accuracy of the model and the computing time. Some embodiments of the invention employ a grid size of 35 nm×35 nm.

In operation 450, the model creation module 380 builds a model for the one class of layout topologies based on the contour deviation information and the density information generated for the plurality of calibration layouts. With various embodiments of the invention, the Response Surface Methodology (RSM) approach is employed. RSM is a well established technique to explore the interplay of one or more input variables to one or more response variables. In the present invention, the input variables are the density information for calibration layouts with different topologies (yet belonging to the same class of layout topologies), while the response variables are the contour deviation information. A transfer function $f(\hat{d})$ converts the density information to the contour deviation information. Equation (1) shows the Taylor series expansion of the transfer function $f(\hat{d})$.

$$f(\hat{d}) = f(\hat{d}_0) + (\hat{d} - \hat{d}_0)^T \nabla f(\hat{d}_0) = (\hat{d} - \hat{d}_0)^T \nabla^2 f(\hat{d}_0)(\hat{d} - \hat{d}_0) + \quad (1)$$

To simplify the computation, an approximation may be made, i.e. assuming a linear relationship between the input variables and the response variables, as shown in Equation (2).

$$f(\hat{d}) = \hat{c}^T \hat{d} \quad (2)$$

With various implementations of the invention, a standard least square regression with two modifications may be used to derive the coefficients. For the first modification, ridge regression is used to prevent any subset of the fitted coefficients from becoming overly large by incorporating the estimated coefficients in the residual squared sum (RSS) in Equation (3). Equation (4) results by setting the derivative to zero and solving for the coefficients. The coefficients may be derived using a Singular Value Decomposition based algorithm.

$$RSS = (\hat{f} - D\hat{c})^T (\hat{f} - D\hat{c}) + \lambda \hat{c}^T \hat{c} \quad (3)$$

$$\hat{c} = (D^T D + \lambda I)^{-1} D^T \hat{f} \quad (4)$$

Experiments with the $\lambda$ changing from 0.1 to 10 show the $R^2$ value (the measurement of the global fit of the model) degraded as the $\lambda$ was increased. However, the RMS (root mean square) value decreased as $\lambda$ increased thereby suggesting that model had higher predictive qualities for higher values of $\lambda$ and that less over-fitting occurred. The max/min residual (predicted-measured) ranges are also decreased as values of $\lambda$ increases.

The value of $\lambda$ may be computed by using the K-fold cross-validation strategy. In this strategy, the plurality of calibration layouts are randomly split into K subsamples. Of the K subsamples, a single subsample is retained as the validation data for testing the model, and the remaining K-1 subsamples are used as training data to build the model with different values of $\lambda$. The validation data is then used to compute the fit statistics for the different values of $\lambda$. This process is repeated K times for each of the K subsamples with each group being set aside as the validation group. The fit statistics is then averaged for all the K-fold and then the $\lambda$ value producing the "best" aggregate fit is used.

The second modification is that weights are assigned inversely proportionally on residuals values (predicted deviation from measured values) when computing the final coefficients values. One of the significant model metrics is the range of the minimum and maximum residual values. After incorporating the residual weights, the min/max residual range may be reduced by ⅓ to almost ½ its original range values. However, the significantly reduced min/max residual range incurs a cost in the slightly degraded $R^2$ and increased RMS values.

As discussed previously, Equation (2) is the basis of the modeling in various embodiments of the invention. Equation (2) is derived by dropping the $2^{nd}$ and higher order terms from the Taylor series, Equation (1). To estimate the model error, the magnitude of the $2^{nd}$ order term may be used on the assumption this term would show large changes before the higher order terms. However, due to the large number of coefficients involved, it may still not be practical to estimate and monitor the model error using this method. Accordingly, various embodiments of the invention employs Equation (5) for error bound modeling.

$$|\hat{d}^T C \hat{d}| \leq f_{ErrorBound} \quad (5)$$

Figure 9:
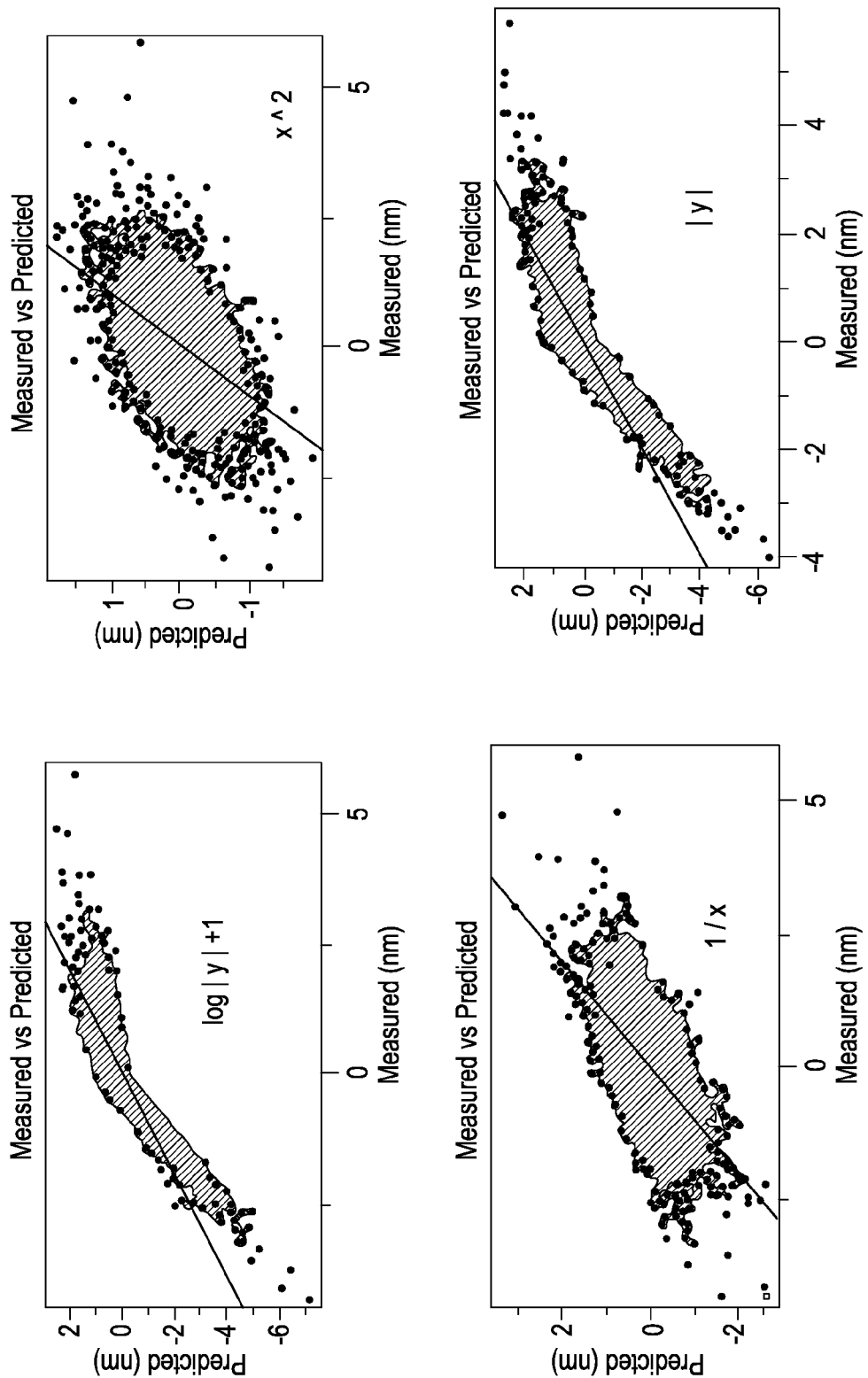
FIG. 9 illustrates predicted vs. actual errors for selected error bound models.

The error bound function $f_{ErrorBound}$ in Equation (5) is desirably to be a tight bound but also computationally inexpensive to create and evaluate. The magnitude of the model output $|y| = f(\hat{d})|$ has been found to be a better $f_{ErrorBound}$ than the model input or some other forms. In FIG. 9 compares predicted errors to actual errors for selected error bound models. As can be seen from the figure, the best fit statistics for an error bound form is Equation (6).

$$f_{ErrorBound} = |y| \quad (6)$$

After the model for the one class of layout topologies is created, the model creation tool 300 may output the result to the output database 385.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A method, comprising:
by a computing device:
receiving layout data for a plurality of calibration layouts, each of the plurality of calibration layouts having a layout topology belonging to a class of layout topologies;
deriving density information for the plurality of calibration layouts based on the layout data;
receiving printed contour information for the plurality of calibration layouts;
deriving contour deviation information for the plurality of calibration layouts based on the printed contour information; and
generating a model for predicting printed contour deviations for the class of layout topologies based on the density information and the contour deviation information, wherein the model is generated using a response surface methodology.

2. The method recited in claim 1, wherein one or more calibration layouts in the plurality of calibration layouts are generated using a place and route tool.

3. The method recited in claim 1, wherein one or more calibration layouts in the plurality of calibration layouts are layout portions extracted from one or more design layouts.

4. The method recited in claim 1, wherein the class of layout topologies is associated with a litho hotspot.

5. The method recited in claim 4, wherein the litho hotspot is line end-to-shape bridging, convex-to-shape bridging, slot end pinching or neighboring convex pinching.

6. The method recited in claim 1, wherein the deriving density information includes:
using a grid to divide each of the plurality of calibration layouts into layout regions; and
calculating a density value for each of the layout regions.

7. The method recited in claim 6, wherein the size of the grid is dependent upon light wavelength.

8. The method recited in claim 1, wherein the printed contour information is generated through a lithography simulation process.

9. The method recited in claim 8, wherein the lithography simulation process includes:
applying one or more RET (resolution enhancement techniques) treatments to the plurality of calibration layouts to obtain a plurality of modified calibration layouts; and
performing lithography simulation on the plurality of modified calibration layouts.

10. The method recited in claim 1, wherein the deriving contour deviation information includes calculating displacement of a printed contour segment relative to a corresponding layout edge segment.

11. The method recited in claim 1, wherein the generating a model includes using a least square regression technique.

12. The method recited in claim 11, wherein the least square regression technique includes ridge regression.

13. The method recited in claim 11, wherein the least square regression technique is modified by assigning weights inversely proportionally on residual values when computing final coefficients.

14. The method recited in claim 11, further comprising:
monitoring model errors dynamically with an error bound function.

15. The method recited in claim 1, wherein the response surface methodology uses at least some of the density information for one or more input variables and at least some of the contour deviation information for one or more response variables.

16. A processor-readable storage device storing processor-executable instructions for causing one or more processors to perform a method, the method comprising:
receiving layout data for a plurality of calibration layouts, each of the plurality of calibration layouts having a layout topology belonging to a class of layout topologies;
deriving density information for the plurality of calibration layouts based on the layout data;
receiving printed contour information for the plurality of calibration layouts;
deriving contour deviation information for the plurality of calibration layouts based on the printed contour information; and
generating a model for predicting printed contour deviations for the class of layout topologies based on the density information and the contour deviation information, wherein the model is generated using a response surface methodology.

17. The processor-readable storage device recited in claim 16, wherein one or more calibration layouts in the plurality of calibration layouts are generated using a place and route tool.

18. The processor-readable storage device recited in claim 16, wherein one or more calibration layouts in the plurality of calibration layouts are layout portions extracted from one or more design layouts.

19. The processor-readable storage device recited in claim 16, wherein the class of layout topologies is associated with a litho hotspot.

20. The processor-readable storage device recited in claim 16, wherein the deriving density information includes:
using a grid to divide each of the plurality of calibration layouts into layout regions; and
calculating a density value for each of the layout regions.

21. The processor-readable storage device recited in claim 16, wherein the printed contour information is generated through a lithography simulation process.

22. The processor-readable storage device recited in claim 21, wherein the lithography simulation process includes:
applying one or more RET (resolution enhancement techniques) treatments to the plurality of calibration layouts to obtain a plurality of modified calibration layouts; and
performing lithography simulation on the plurality of modified calibration layouts.

23. The processor-readable storage device recited in claim 16, wherein the deriving contour deviation information includes calculating displacement of a printed contour segment relative to a corresponding layout edge segment.

24. The processor-readable storage device recited in claim 16, wherein the generating a model includes using a least square regression technique.

25. The processor-readable storage device recited in claim 24, wherein the least square regression technique includes ridge regression.

26. The processor-readable storage device recited in claim 24, wherein the least square regression technique is modified by assigning weights inversely proportionally on residual values when computing final coefficients.

27. The processor-readable storage device recited in claim 24, further comprising:
monitoring model errors dynamically with an error bound function.

28. The processor-readable storage device recited in claim 16, wherein the response surface methodology uses at least some of the density information for one or more input variables and at least some of the contour deviation information for one or more response variables.

* * * * *